(12) United States Patent
Buber et al.

(10) Patent No.: US 6,657,522 B2
(45) Date of Patent: Dec. 2, 2003

(54) WIDE BANDWIDTH BIAS TEE

(75) Inventors: M. Tekamul Buber, Nashua, NH (US); Adil Khalil, Lowell, MA (US); Robert Ian Gresham, Somerville, MA (US)

(73) Assignee: M/A-Com, Lowell, MA (US)

( * ) Notice: Subject to any disclaimer, the term of this patent is extended or adjusted under 35 U.S.C. 154(b) by 0 days.

(21) Appl. No.: 10/061,764

(22) Filed: Feb. 1, 2002

(65) Prior Publication Data

US 2003/0146809 A1 Aug. 7, 2003

(51) Int. Cl.[7] ............................. H03H 1/02; H03H 7/06
(52) U.S. Cl. ........................ 333/245; 333/172; 333/185
(58) Field of Search ................................ 333/172, 181, 333/245, 185; 330/296, 302, 306

(56) References Cited

U.S. PATENT DOCUMENTS

| | | | | |
|---|---|---|---|---|
| 5,105,172 A | * | 4/1992 | Khatibzadeh et al. | 333/175 |
| 5,241,284 A | * | 8/1993 | Nyqvist et al. | 330/297 |
| 5,495,180 A | * | 2/1996 | Huang et al. | 333/238 |
| 5,760,662 A | * | 6/1998 | Kalb et al. | 333/172 |
| 6,273,400 B1 | * | 8/2001 | Kuchta | 257/94 |
| 6,285,542 B1 | * | 9/2001 | Kennedy et al. | 333/172 |

* cited by examiner

*Primary Examiner*—Seungsook Ham

(57) ABSTRACT

A wide bandwidth bias tee including a high frequency terminal, a first resistor coupled between the high frequency terminal and a capacitor, a second resistor coupled to the capacitor, the second resistor coupled in series with the first resistor, and a low frequency terminal, the low frequency terminal coupled to the second resistor.

12 Claims, 4 Drawing Sheets

WIDE BANDWIDTH BIAS TEE

FIELD OF THE INVENTION

The present invention relates to the field of signal transmission, and more particularly to a bias tee for inserting low frequency signals on high frequency transmission lines.

BACKGROUND OF THE INVENTION

Bias tees are widely used to insert low frequency (e.g., DC) signals onto high frequency (e.g., radio frequency (RF)) lines. FIG. 1 shows a schematic diagram of a conventional bias tee 100. The bias tee 100 includes a high frequency input terminal 110 and a low frequency input terminal 120. The bias tee 100 also includes a first resistor (R1) 135 coupled between the high frequency input terminal 110 and ground, and a series-connected capacitor (C1) 140 and second resistor (R2) 150 coupled between the high frequency input terminal 110 and ground.

In operation, a high frequency (e.g., RF) transmission line (not shown) is coupled to the high frequency input terminal 110 and a low frequency (e.g., DC) signal (not shown) is applied at the low frequency input terminal 120. It will be noted by those skilled in the art that the high frequency signal (not shown) present on the high frequency transmission line is grounded through first resistor 135. Additionally, the high frequency signal is prevented from reaching the low frequency input terminal 120 by the first capacitor 140 and the second resistor 150. As is well known in the art, the first capacitor 140 will operate as a virtual short circuit with respect to high frequency signals, thereby shunting all such signals to ground through the second resistor 150. The low frequency signal applied at low frequency input terminal 120 however will pass through to the high frequency transmission line coupled to the high frequency input terminal 110 (since first capacitor 140 operates as an open circuit with respect to the low frequency signal). In this manner, a DC bias signal may be carried on the high frequency transmission line along with the high frequency signal.

However, in the bias tee 100 shown in FIG. 1, a high frequency signal which is present at high frequency input terminal 110 must pass through both the capacitor 140 and the second resistor 150 before reaching ground which increases the total impedance to ground. Furthermore, when the bias tee is formed monolithically, the high frequency signal must pass through a via between the first capacitor 140 and ground formed on a lower surface of the monolithic substrate (e.g., glass). Since the diameter of the via is typically small, the via exhibits a high inductance, and therefore limits the bandwidth of the bias tee 100. It will be noted by those of ordinary skill in the art that a wide bandwidth is necessary for almost all high frequency applications.

Therefore, there is presently a need for a wide bandwidth bias tee.

SUMMARY OF THE INVENTION

The present invention includes a wide bandwidth bias tee including a high frequency terminal, a first resistor coupled between the high frequency terminal and a capacitor, a second resistor coupled to the capacitor, the second resistor coupled in series with the first resistor, and a low frequency terminal, the low frequency terminal coupled to the second resistor.

The present invention also includes an integrated circuit bias tee comprising a substrate including a grounding pedestal layer formed therein, a capacitor plate structure disposed on the grounding pedestal layer, at least one first resistor formed on a first side of the capacitor plate structure and coupled thereto, and at least one second resistor formed on a second opposing side of the capacitor plate structure and coupled thereto.

Additionally, the present invention comprises a method for increasing the bandwidth of a bias tee including, disposing a capacitor of the bias tee on a first surface of a monolithic substrate and disposing a ground pedestal in the monolithic substrate and coupling a plate of the capacitor directly thereto.

DETAILED DESCRIPTION OF THE INVENTION

The present invention comprises a wide-band bias tee which is preferably formed as a monolithic microwave integrated circuit (MMIC). The bias tee is designed to permit insertion of a low frequency (e.g., DC) signal onto a high frequency (e.g., radio frequency (RF)) transmission line.

Figure 1:
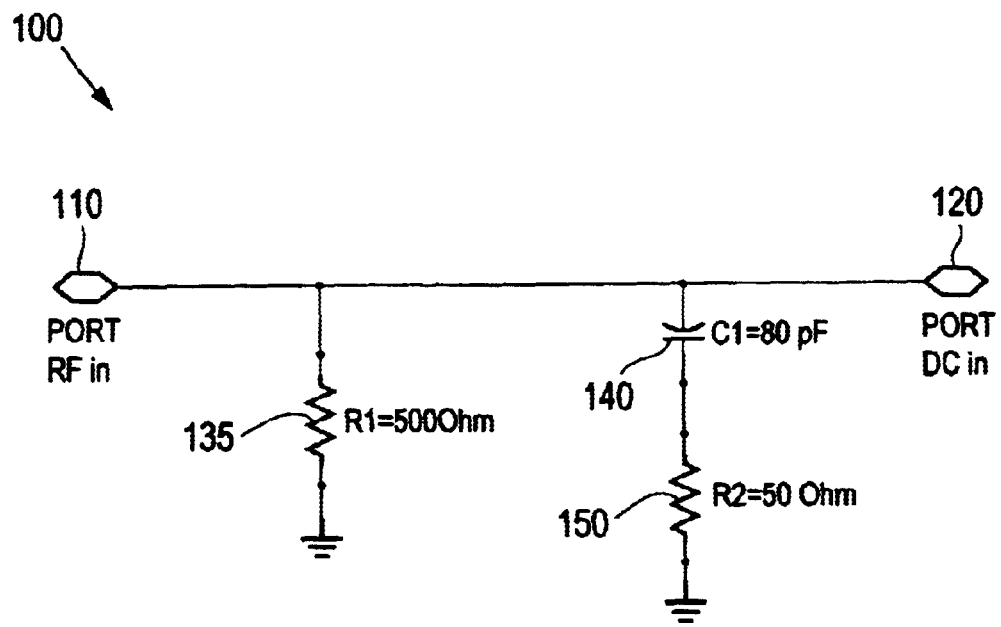
FIG. 1 is a schematic diagram of a conventional bias tee.
Figure 2:
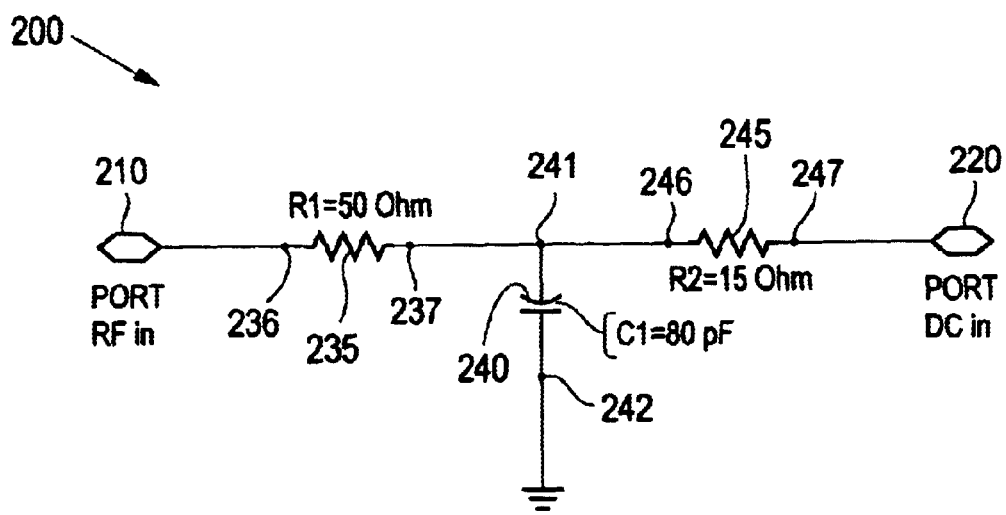
FIG. 2 is a schematic diagram of a bias tee according to a first exemplary embodiment of the present invention.

Referring now to FIG. 2, there is shown a schematic diagram of a bias tee 200 according to a first exemplary embodiment of the present invention. The bias tee 200 includes a high frequency (e.g., RF) input terminal 210 and a low frequency (e.g., DC) input terminal 220. The bias tee 200 also includes a first resistor 235 connected in series with the high frequency input terminal, a first capacitor 240 coupled between a terminal of the first resistor and ground, and a second resistor 245 coupled in series with the first resistor. The first resistor 235 includes first 236 and second terminals 237, and the second resistor 245 also includes first 246 and second 247 terminals. Similarly, the first capacitor 240 includes first 241 and second 242 terminals. As shown in FIG. 2, the high frequency input terminal 210 is coupled to the first terminal 236 of the first resistor 235, and the first terminal 241 of the first capacitor 240 is coupled to the second terminal 237 of the first resistor. Additionally, the first terminal 246 of the second resistor 245 is coupled to the first terminal 241 of the first capacitor, and the second terminal 247 of the second resistor 245 is coupled to the low frequency input terminal 220. In an exemplary embodiment for a frequency range from 1–40 GigaHertz (GHz), the first resistor has a resistance value of 50 Ohms, the second resistor has a resistance value of 15 Ohms, and the first capacitor has a capacitance value of 80 picofarads.

In operation, a high frequency (e.g., RF) transmission line is coupled to the high frequency input terminal 210 and a low frequency (e.g., DC) signal is applied at the low frequency input terminal 220. It will be noted by those skilled in the art that the high frequency signal present on the high frequency transmission line is grounded through first capacitor 240. This grounding of high frequency signals through capacitor 240 substantially prevents high frequency signals from reaching the low frequency input terminal 220. As is well known in the art, the first capacitor 240 will operate as a virtual short circuit with respect to high frequency signals, thereby shunting such high frequency signals to ground. The low frequency signal applied at low frequency input terminal 220 however will pass through to the high frequency transmission line coupled to the high frequency input terminal 210 (since first capacitor 240 operates as an open circuit with respect to the low frequency signal). In this manner, a low frequency (e.g., DC) bias signal may be carried on the high frequency transmission line along with the high frequency signal.

Figure 3:
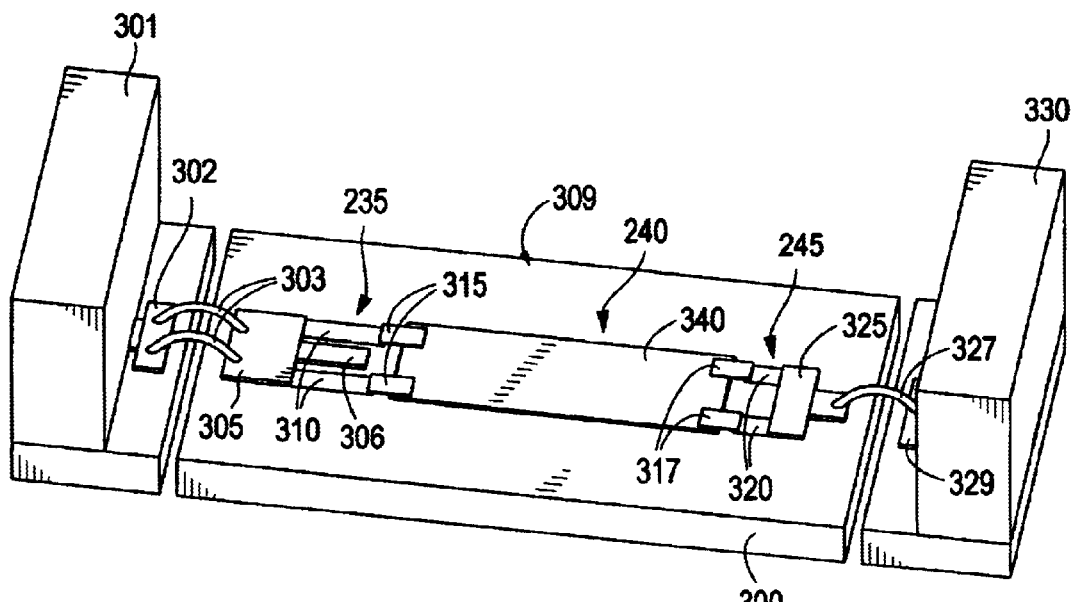
FIG. 3 shows a perspective view of the monolithically formed bias tee shown in FIG. 2.

FIG. 3 shows a perspective view of the bias tee 200 of FIG. 2 formed monolithically. The bias tee 200 may be formed on an upper surface 309 of a substrate 300, which is preferably made of glass, but may me made of any suitable material (e.g., Gallium Arsenide (GaAs), Silicon (Si)).

The first capacitor 240 may be formed as a plate structure 340 of a suitable conducting material (e.g., Gold (Au), etc.). A first set of air bridges 315 couple the capacitor plate structure 340 to the first resistor 235 which is formed of two parallel-connected resistive strips 310. In order to form the 50 Ohm resistance of the first resistor 235, each of the resistive strips 310 are formed to have a 100 Ohm resistance. Thus, when the resistive strips 310 are connected in parallel, the combined resistance thereof becomes 50 Ohms. The resistive strips 310 are coupled to the air bridges 315 at one end, and coupled to a first input land 305 at the other end thereof. The first input land 305 also has coupled thereto a compensating capacitor 306 which is not shown in the schematic diagram of FIG. 2. This compensating capacitor 306 compensates for the inductance of the resistive strips 310, and assists in achieving a broadband match for the bias tee 200. A pair of wire bonds 303 are coupled to one portion of the first input land 305 and couple the input land to a first package input land 302 formed on a surface of a first portion 301 of a package substrate (only partially shown). The package substrate is essentially a substrate with a recess formed therein for receiving and retaining the bias tee 200. The wire bonds 303, along with the first input land 305 and first package input land 302 form the first (terminal) resistance value 235 of the bias tee 200.

A second set of air bridges 317 couple the capacitor plate structure 340 to the second resistor 245, which is formed of two parallel-connected resistive strips 320. In order to form the 15 Ohm resistance of the third resistor 245, each of the resistive strips 320 are formed to have a 30 Ohm resistance. Thus, when the resistive strips 320 are connected in parallel, the combined resistance thereof becomes 15 Ohms. The resistive strips 320 are coupled to the air bridges 317 at one end, and coupled to a second input land 325 at the other end thereof. The second input land 325 is coupled to a second package input land 329 (of a second portion 330 of the package substrate) by a wire bond 327.

Figure 4:
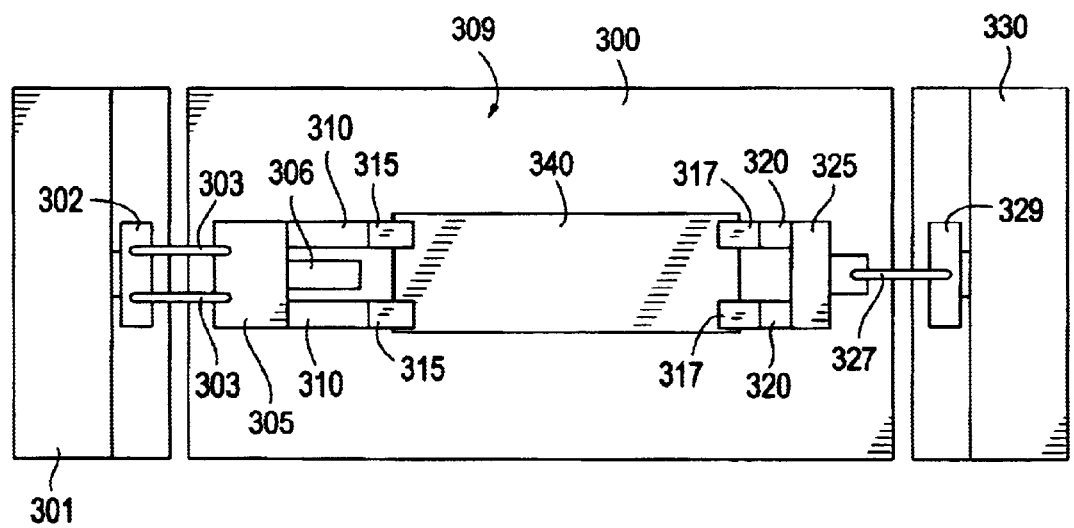
FIG. 4 shows a top plan view of the monolithically formed bias tee shown in FIG. 3.

FIG. 4 shows a top plan view of the monolithically-formed bias tee 200 shown in FIG. 3. In order to achieve a high capacitance value for the capacitor plate structure 340, the length of the capacitor plate structure should be increased since the width of the capacitor plate structure is restricted by the pitch requirement (e.g., distance between two respective bias tees on a chip) of the bias tee array. However, an increase in the length of the capacitor plate structure 340 also increases inductance of the monolithic bias tee 200, which may adversely impact upon return losses at high frequencies (e.g., approximately 30–40 GigaHertz (GHz)). The preferred dimensions for the elements of the monolithically-formed bias tee 200 are shown in the table below:

| Element | Length | Width |
|---|---|---|
| Capacitor Plate Structure 340 | 795 μm | 325 μm |
| Resistive Strips 310, 320 | Variable Depending Upon Desired Resistance Value | 75 μm |
| Compensating Capacitor 306 | 190 μm | 85 μm |
| Input Land 305 | 190 μm | 285 μm |

Figure 5:
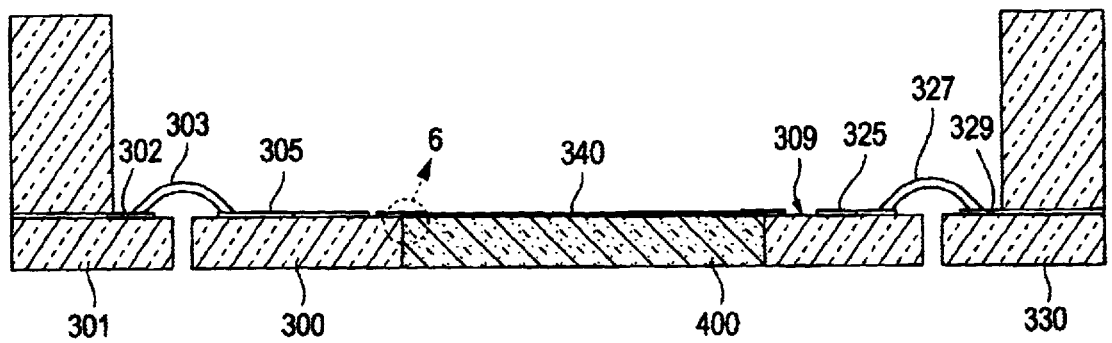
FIG. 5 shows a cross sectional view of the monolithically formed bias tee shown in FIG. 3.

FIG. 5 shows a cross sectional view of the monolithically formed bias tee 200 shown in FIG. 3. As shown in FIG. 5, a grounding pedestal layer 400 is disposed in the substrate 300 beneath the capacitor plate structure 340. The grounding pedestal layer 400 is preferably formed primarily of a semiconductive material (e.g., Silicon (Si)). The side surfaces 410 of the grounding pedestal layer 400 which confront the substrate 300 are preferably formed of a different semiconductive or conductive material (e.g., Cobalt Silicate (CoSi), Silver (Ag), Gold (Au), etc.) (See FIG. 6). These side surfaces 410 are preferably at least 1 μm thick. The grounding pedestal layer 400 operates as a ground for the capacitor plate structure 340. Advantageously, the grounding pedestal layer 400 permits the capacitor plate structure 340 to be grounded on an upper surface 309 of the substrate 300 (as opposed to on the lower surface of the substrate as in the conventional bias tee). Grounding of the capacitor plate structure 340 on the same plane as the capacitor plate structure substantially eliminates the inductance introduced by vias between the upper and lower surfaces of the substrate 300 (as in the conventional bias tee). Elimination of this inductance permits the bias tee 200 to operate over a wider bandwidth.

It will be noted by those skilled in the art that from the perspective of the high frequency signals present at the high frequency input port (110; FIG. 2), the capacitor plate structure 340 appears as a variable capacitor when the grounding pedestal layer 400 and the capacitor plate structure are disposed on the same plane. In other words, the higher the frequency of the input signal, the more quickly the signal will be grounded through the capacitor plate structure 340 and the pedestal 400. This phenomenon, in turn, also causes a decrease in the series inductance of the capacitor plate structure 340. For example, as the frequency of the signal decreases, the capacitor plate structure 340 presents a higher inductance to the signal. However, at lower frequencies, series inductance is less significant than at higher frequencies.

Figure 6:
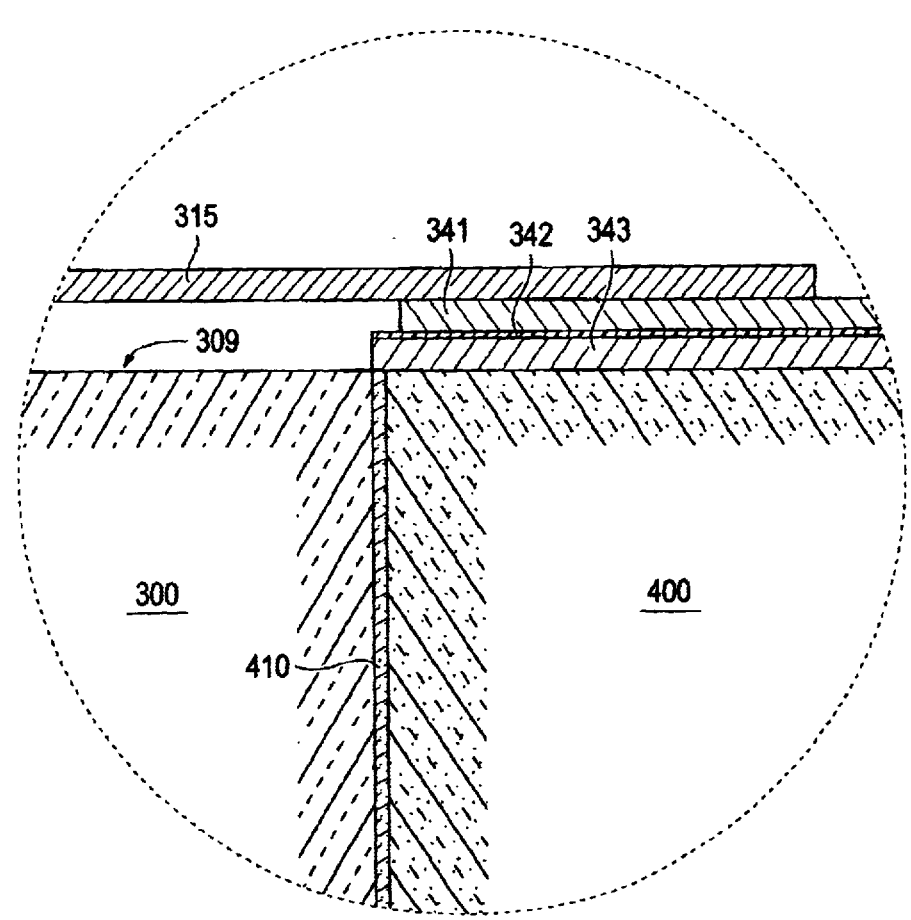
FIG. 6 shows an enhanced view of the area "6" shown in FIG. 5.

FIG. 6 shows an enhanced view of a portion of the monolithically formed bias tee 200. As shown in FIG. 6, the capacitor plate structure 340 includes an upper conductive plate 341, a lower conductive plate 343 and a dielectric 342 sandwiched therebetween. The lower conductive plate 343 of the capacitor plate structure lies on the grounding pedestal layer 400 formed in the substrate 300. The air bridges 315 contact the upper conductive plate 341 and serve to relay signals to the capacitor. Preferably, the substrate 300 is approximately 125 μm thick and the dielectric 342 is approximately 0.2 μm thick. The grounding pedestal layer 400 preferably has a thickness the same as the thickness of the substrate 300, namely 125 μm. The conductive plates 341, 343 should each be approximately 2.5 μm, and the air bridge 315 is preferably approximately 2.5 μm thick.

Figure 7:
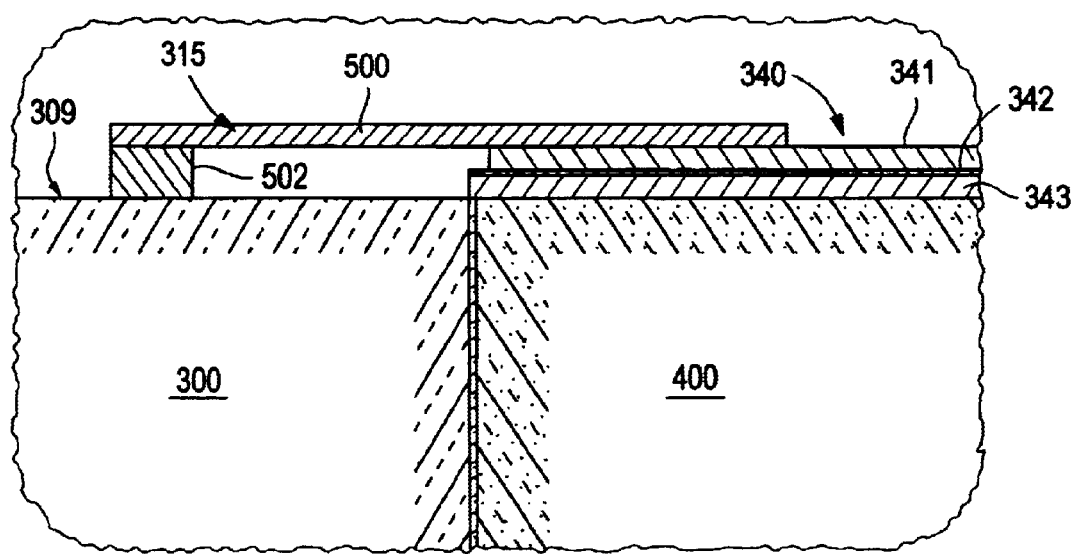
FIG. 7 shows an enhanced view of the monolithically formed bias tee shown in FIG. 3 showing the construction of the air bridges.

FIG. 7 shows an enhanced view of the monolithically formed bias tee 200 shown in FIG. 3 showing the construction of the air bridges 315. As shown in FIG. 7, the air bridges 315 are comprised of a bridge member 500 and a post member 502. The post member 500 should be fabricated to have approximately the same height as the capacitor plate structure 340 so that the bridge member can lie flush on the upper conductive plate 341 of the capacitor plate structure. The bridge member 500 and the post member 502 are preferably formed of Gold (Au).

Since in the exemplary bias tee 200 the capacitor plate structure 340 is directly grounded on the same plane (and not grounded through a via as in the conventional bias tee 100), the present bias tee has a much wider bandwidth than conventional bias tees (due at least in part to the reduction of the inductance of the grounding via). The capacitor plate structure 340 may be disposed over a grounding pedestal layer 400 as wide as the width of the monolithic capacitor plates 341, 343. It is beneficial to make the width of the grounding pedestal layer 400 as large as the width of the capacitor plates 341, 343 in order to minimize the inductance of the pedestal layer. In general, the wider the grounding pedestal layer 400, the lower the inductance. Theoretically, one could make the grounding pedestal layer 400 wider than the capacitor plates 341, 343, but that may conflict with the pitch requirement of the chip. If one builds only one bias tee on a chip, then one could of course make the grounding pedestal layer 400 wider than the capacitor plates 341, 343. When putting several bias tees next to each other on a chip, one could be tempted to build one large grounding pedestal layer 400 for all bias tees on the chip, but such a structure will increase coupling and reduce isolation between the RF lines which is undesired. Therefore, one builds a separate grounding pedestal layer 400 for each bias tee on the chip. Accordingly, making the width of the capacitor plates 341, 343 equal to the width of the grounding pedestal layer 400 may represent an ideal compromise.

The formation of the grounding pedestal layer 400 and the capacitor plate structure 340 may be accomplished through monolithic microwave integrated circuit (MMIC) and hybrid microwave integrated circuit (HMIC) techniques.

Figure 8:
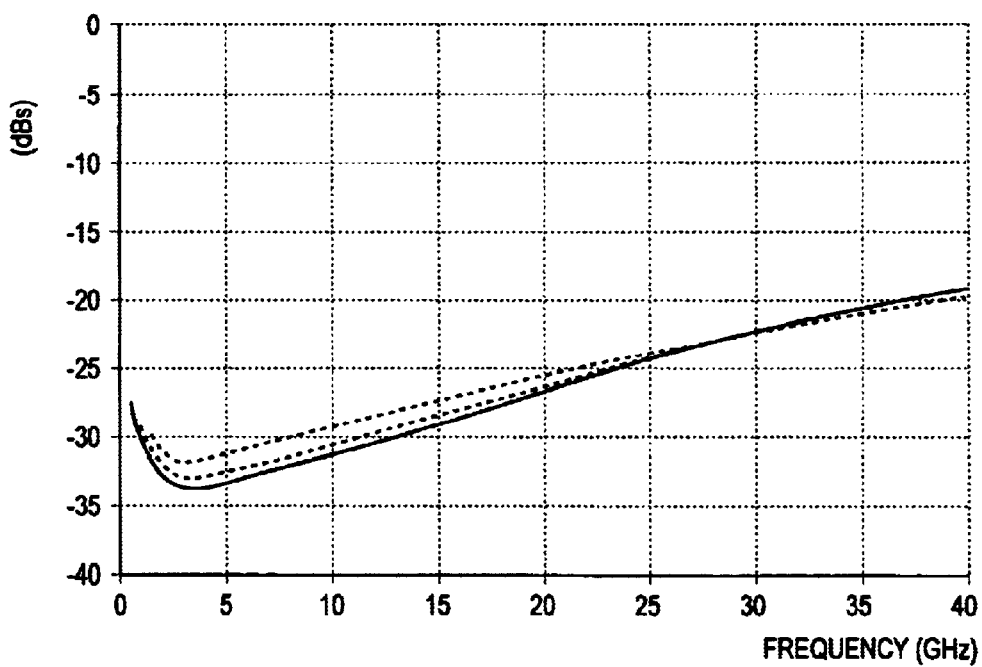
FIG. 8 is a graph showing an exemplary frequency response of the bias tee of FIG. 2.

FIG. 8 shows a response curve for the bias tee 200 according to the present invention. As will be noted by those skilled in the art, the bias tee 200 exhibits a return loss less than 18 dB in the range of frequencies from 1 to 40 GigaHertz (GHz).

While the foregoing invention has been described with reference to the above embodiments, various modifications and changes can be made without departing from the spirit of the invention. Accordingly, all such modifications and changes are considered to be within the scope of the appended claims.

What is claimed is:

1. An integrated circuit bias tee comprising:
   a device substrate including a grounding pedestal layer formed therein;
   a capacitor plate structure disposed on the grounding pedestal layer;
   at least one first resistor formed on a first side of the capacitor plate structure and coupled to the capacitor plate structure; and,
   at least one second resistor formed on a second opposing side of the capacitor plate structure and coupled to the capacitor plate structure.

2. An integrated circuit bias tee comprising:
   a device substrate including a grounding pedestal layer formed therein;
   a capacitor plate structure disposed on the grounding pedestal layer;
   at least one first resistor formed on a first side of the capacitor plate structure and coupled to the capacitor plate structure;
   at least one second resistor formed on a second opposing side of the capacitor plate structure and coupled to the capacitor plate structure
   at least one first air bridge coupling the capacitor plate structure to the at least one first resistor; and,
   at least one second air bridge coupling the capacitor plate structure to the at least one second resistor.

3. An integrated circuit bias tee comprising:
   a device substrate including a grounding pedestal layer formed therein;
   a capacitor plate structure disposed on the grounding pedestal layer;
   at least one first resistor formed on a first side of the capacitor plate structure and coupled to the capacitor plate structure; and,
   at least one second resistor formed on a second opposing side of the capacitor plate structure and coupled to the capacitor plate structure,
   wherein the at least one first resistor comprises at least two resistive elements coupled in parallel.

4. An integrated circuit bias tee comprising:
   a device substrate including a grounding pedestal layer formed therein;
   a capacitor plate structure disposed on the grounding pedestal layer;
   at least one first resistor formed on a first side of the capacitor plate structure and coupled to the capacitor plate structure; and,
   at least one second resistor formed on a second opposing side of the capacitor plate structure and coupled to the capacitor plate structure,
   wherein the at least one second resistor comprises at least two resistive elements coupled in parallel.

5. The integrated circuit bias tee of claim 2, wherein the at least one first air bridge comprises a bridge member and a post member.

6. The integrated circuit bias tee of claim 2, wherein the at least one second air bridge comprises a bridge member and a post member.

7. The integrated circuit bias tee of claim 2, wherein the capacitor plate structure comprises:
   a first conductive plate;
   a second conductive plate; and,
   a dielectric disposed between the first and second conductive plates.

8. The integrated circuit bias tee of claim 7, wherein the first conductive plate of the capacitor plate structure is disposed on the grounding pedestal layer.

9. The integrated circuit bias tee of claim 2, further comprising:
   a first input land coupled to the at least one first resistor; and
   a second input land coupled to the at least one second resistor.

10. The integrated circuit bias tee of claim 9, further comprising:

at least one wire bond coupling the first input land to a first package input land; and, at least one wire bond coupling the second input land to a second package input land, wherein said first and second package input lands are disposed on a package substrate different from said device substrate.

11. The integrated circuit bias tee of claim 3, further comprising:

a compensating capacitor formed between the at least two parallel-coupled resistive elements.

12. A method for increasing the bandwidth of a bias tee comprising the steps of:

disposing a capacitor of the bias tee on a first surface of a monolithic substrate;

disposing a first resistor on a first side of the capacitor; and, disposing a ground pedestal in the monolithic substrate and coupling a plate of the capacitor directly to the ground pedestal, wherein the step of disposing a first resistor on a first side of the capacitor comprises:

disposing a first and second resistive strips in parallel with each other, the resistance of each resistive strip being approximately equal to twice the desired resistance value of the first resistor.

* * * * *